United States Patent [19]
Kim et al.

[11] Patent Number: 5,644,543
[45] Date of Patent: Jul. 1, 1997

[54] SEMICONDUCTOR MEMORY APPARATUS HAVING SENSE AMPLIFIERS CONNECTED TO BOTH ENDS OF A PAIR OF BIT LINES

[75] Inventors: Tae Hyoung Kim; Jin Hong Ahn, both of Kyungki-Do, Rep. of Korea

[73] Assignee: LG Semicon Co., Ltd., Cheongju, Rep. of Korea

[21] Appl. No.: 586,392

[22] Filed: Jan. 16, 1996

[30] Foreign Application Priority Data

Nov. 20, 1995 [KR] Rep. of Korea .................. 42224/1995

[51] Int. Cl.⁶ ........................................... G11C 7/00
[52] U.S. Cl. ................. 365/207; 365/222; 365/233
[58] Field of Search .................. 365/207, 222, 365/233

[56] References Cited

U.S. PATENT DOCUMENTS 4,811,302  3/1989  Koishi ...................... 365/222
5,307,314  4/1994  Lee ........................ 365/189.04

Primary Examiner—David C. Nelms
Assistant Examiner—Andrew Q. Tran
Attorney, Agent, or Firm—Fleshner & Kim

[57] ABSTRACT

An improved memory driving method for a semiconductor memory apparatus capable of achieving a series of data accesses by connecting two sense amplifying units to a pair of bit lines, which includes the steps of a first step which senses a data of a memory cell selected by a word line driver and stores the thusly sensed data into a first sense amplifying unit in accordance with a switching operation of a first switch; a second step which selects another memory cell during a sensing operation of the first sense amplifying unit and stores a data of the memory cell into a second sense amplifying unit in accordance with a switching operation of a second switch; and a third step which records data stored in the first sense amplifying unit and second sense amplifying unit into selected memory cells, respectively, in accordance with a certain line and a switch signal, so that data access time of the system can be advantageously reduced.

3 Claims, 7 Drawing Sheets

WL1

SW1

BL1, $\overline{BL1}$

SL1, $\overline{SL1}$

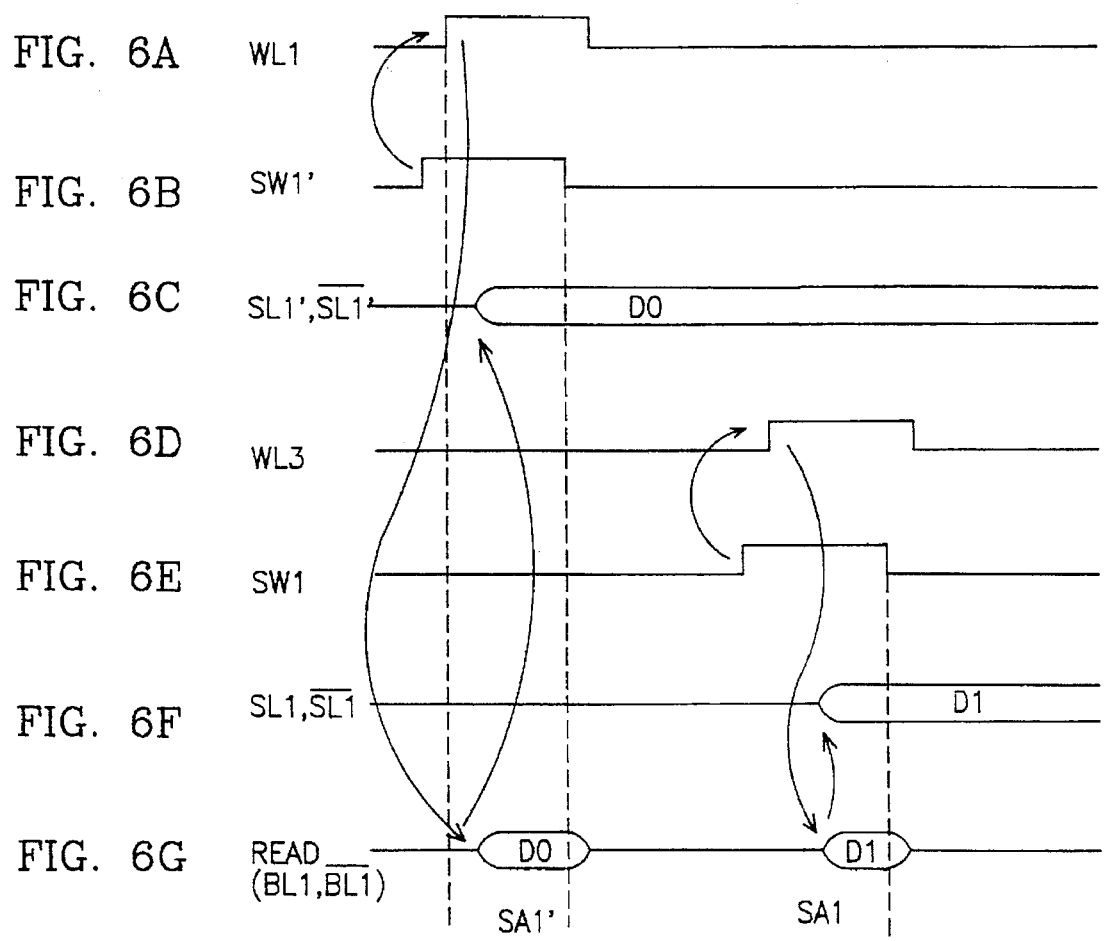

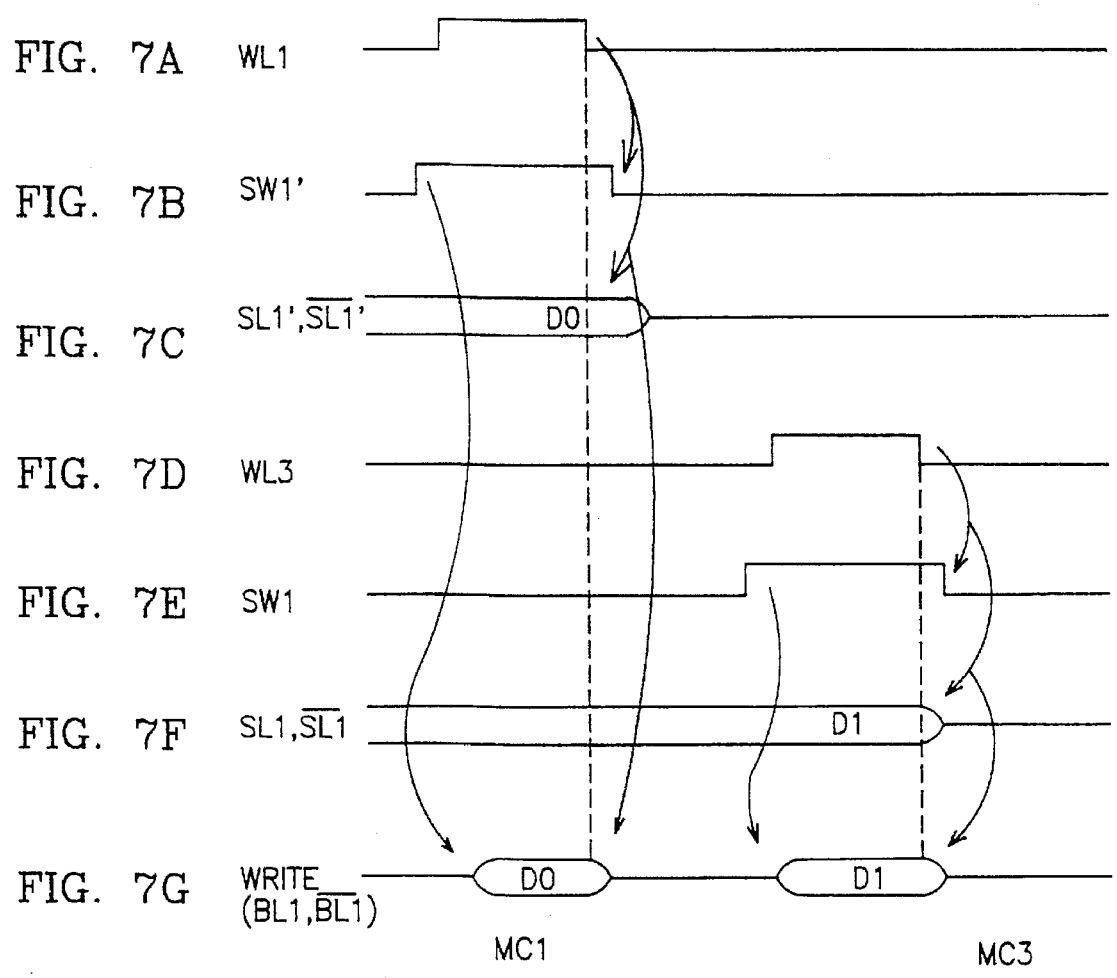

5,644,543

SEMICONDUCTOR MEMORY APPARATUS HAVING SENSE AMPLIFIERS CONNECTED TO BOTH ENDS OF A PAIR OF BIT LINES

BACKGROUND OF THE INVENTION

1. Field of the Invention

The present invention relates to a memory driving method for a semiconductor memory apparatus capable of achieving a series of data accesses by connecting two sense amplifying unit to a pair of bit lines.

2. Description of the Conventional Art

As well known to those who skilled in the art, FIG. 1 shows a conventional semiconductor apparatus, which includes a memory array having a plurality of word lines WL and a plurality of pairs of bit lines BL and /BL, here the word lines WL cross the pairs of the bit lines BL and /BL, and a plurality of memory cells MC disposed at each crossing point therebetween, a row decoder 2 for selecting a certain word line WL, a column decoder 3 for selecting a certain pair of bit lines of the pairs of the bit lines BL and /BL, a switching unit 4 connected to the pairs of the bit lines BL and /BL for controlling the output of the data outputted from the memory cell MC, and a sense amplifying unit 5 connected to the pairs of the bit lines BL and /BL through the switching unit 4 for amplifying the output of the memory cell MC to a certain level.

The sense amplifying unit 4 is directed to sensing the data contained in the bit lines BL and /BL and includes a plurality of bidirectional latch type sense amplifying units SA for recording the sensed data in the memory cells MC.

In addition, FIG. 2 shows a conventional semiconductor memory apparatus in more detail.

The memory driving method of a conventional semiconductor memory apparatus will now be explained with reference to FIGS. 1 through 3.

To begin with, as shown in FIG. 3B, in a state that a switch S1 is turned on by a switching control signal SW1, when a word line signal of a high level as shown in FIG. 3A is inputted to the row decoder 2, a data stored in a memory cell MC1 located at a crossing point between a word line WL1 and a bit line BL1 is outputted, and the bit lines BL1 and /BL1 are charged and discharged as shown in FIG. 3C.

In addition, an electric charge charged and discharged to the bit lines BL1 and /BL1 is inputted to a sense amplifying unit SA1 through a switch SW1 and input and output lines SL1 and /SL1 of the sense amplifying unit as shown in FIG. 3D, and the sense amplifying unit SA1 amplifies the electric charge to a certain level and restores the thusly amplified electric charge to the memory cell MC1 through the input and output lines SL1 and /SL1 of the sense amplifying unit, and is reset when the word line signal WL1 is turned to a low level.

Thereafter, one of other word lines is selected, and the sensing and restoring operations are performed with respect to the data stored in a corresponding memory cell in the same method as explained above, so that the operations thereof are accomplished.

However, since the conventional memory driving method is directed to repeatedly performing the operations for selecting a certain word line and performing sensing, restoring data stored in a corresponding memory cell, and resetting the sense amplifying unit, so that data access efficiency of memory is decreased.

SUMMARY OF THE INVENTION

Accordingly, it is an object of the present invention to provide a memory driving method for a semiconductor memory apparatus, which overcome the problems encountered in a conventional memory driving method for a semiconductor memory apparatus.

It is another object of the present invention to provide an improved memory driving method for a semiconductor memory apparatus capable of achieving a series of data accesses by connecting two sense amplifying units to a pair of bit lines.

To achieve the above objects, there is provided a memory driving method for a semiconductor memory apparatus, which includes the steps of a first step which senses a data of a memory cell selected by a word line driver and stores the thusly sensed data into a first sense amplifying unit in accordance with a switching operation of a first switch; a second step which selects another memory cell during a sensing operation of the first sense amplifying unit and stores a data of the memory cell into a second sense amplifying unit in accordance with a switching operation of a second switch; and a third step which records data stored in the first sense amplifying unit and second sense amplifying unit into selected memory cells, respectively, in accordance with a certain line and a switch signal.

BRIEF DESCRIPTION OF THE DRAWINGS

FIGS. 6A through 6G are diagrams of a timing of each element in a reading mode of FIG. 5 of a semiconductor memory apparatus according to the present invention.

FIGS. 7A through 7G are diagrams of a timing of each element in a recording mode of FIG. 5 of a semiconductor memory apparatus according to the present invention.

DETAILED DESCRIPTION OF THE INVENTION

Figure 1:
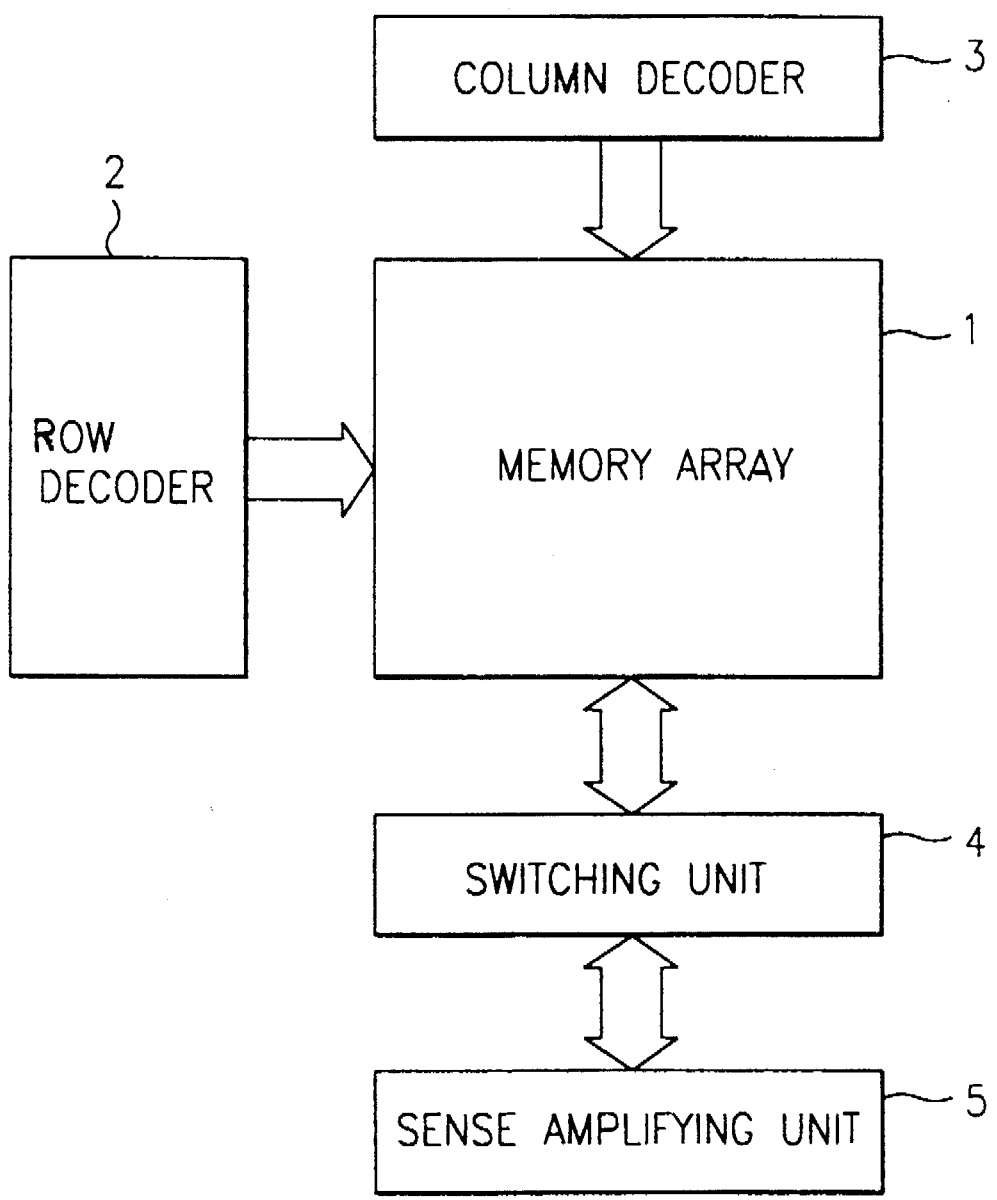
FIG. 1 is a block diagram of a conventional semiconductor memory apparatus.
Figure 2:
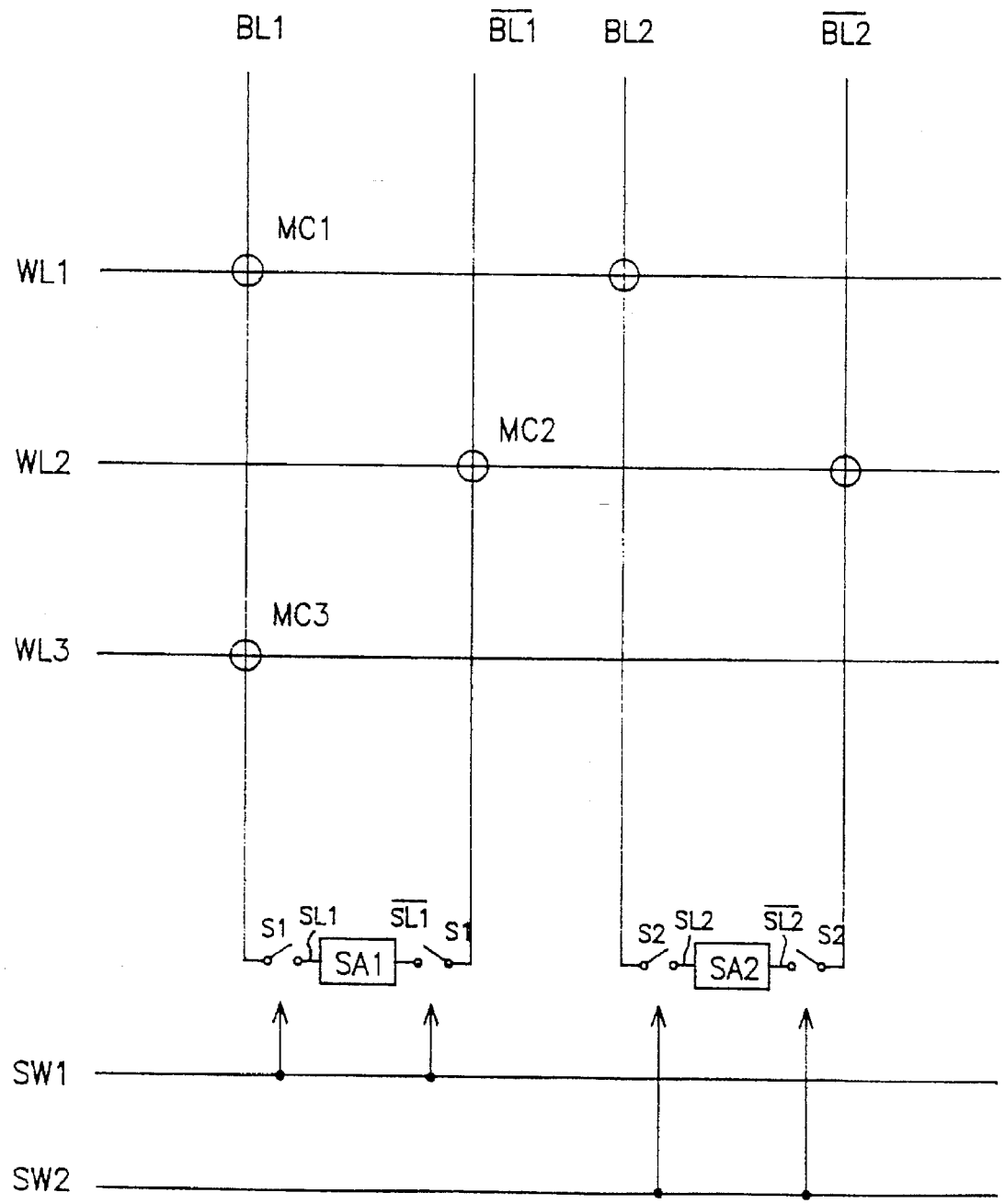
FIG. 2 is a diagram of a relationship between word lines and bit lines of a conventional semiconductor memory apparatus of FIG. 1.
Figure 3A:
FIGS. 3A through 3D are diagrams of timings of each element of FIG. 2 of a conventional semiconductor memory apparatus.
Figure 3B:
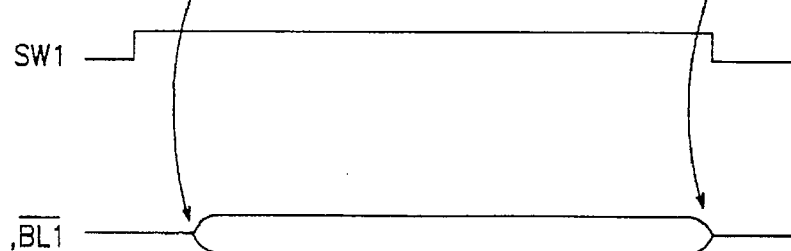
Figure 3C:
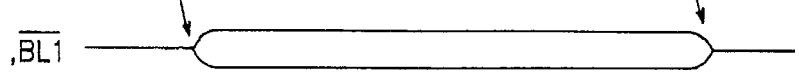
Figure 3D:
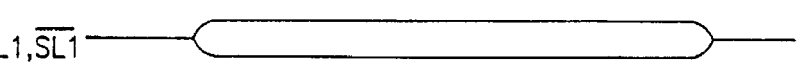
Figure 4:
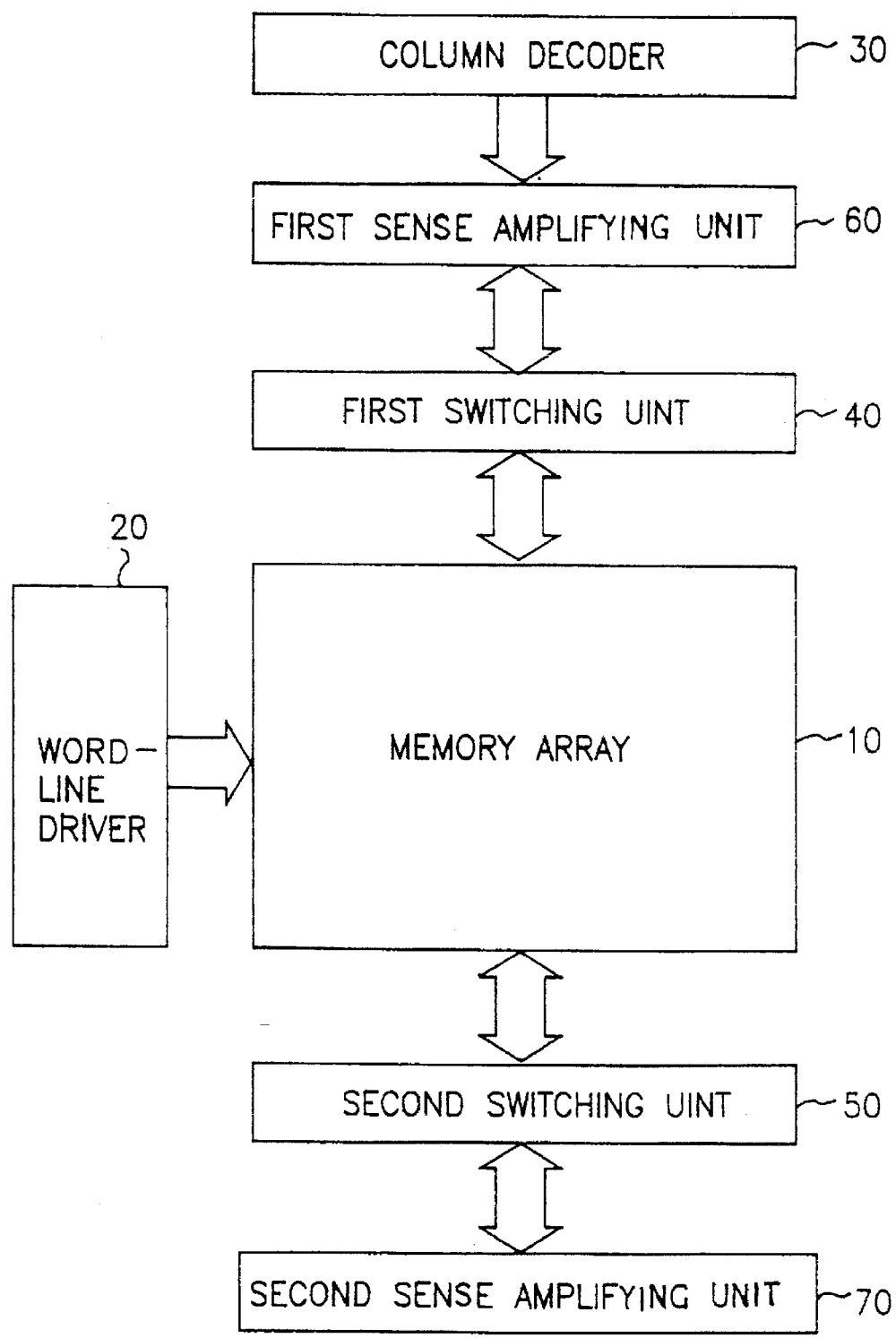
FIG. 4 is a block diagram of a semiconductor memory apparatus according to the present invention.
Figure 5:
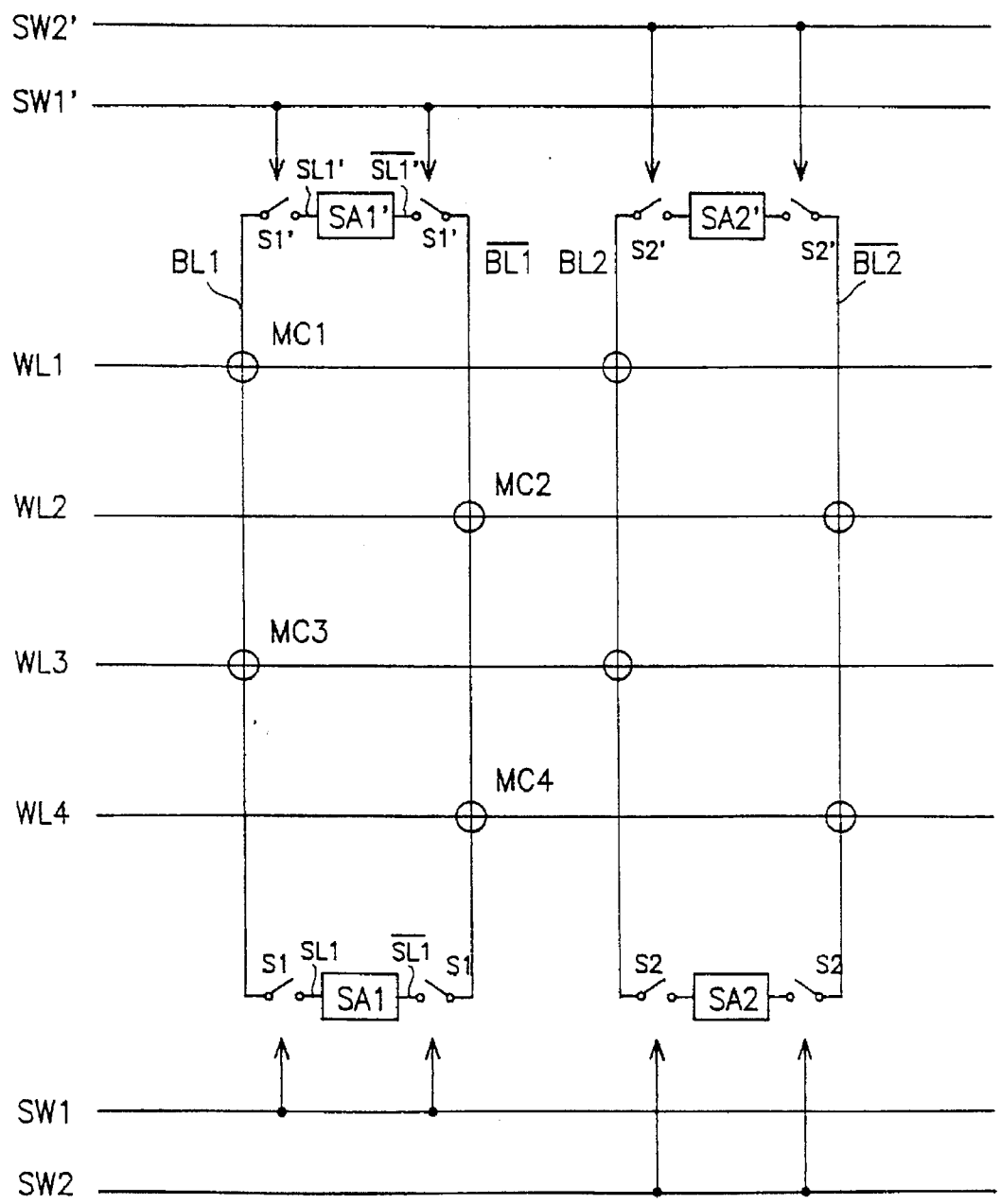
FIG. 5 is a diagram of a relationship between word lines and bit lines of a semiconductor memory apparatus according to the present invention.

FIGS. 4 and 5 show a semiconductor memory apparatus according to the present invention, which includes a memory array 10 having a plurality of word lines WL and a plurality of pairs of bit lines, here the word lines WL cross the pair of bit lines, a word line driver 20 for driving a plurality of word lines WL, a column decoder 30 for selecting a certain pair of bit lines of the plurality of pairs of bit lines BL and /BL, fast and second switching unit 40 and 50 connected to the pairs of the bit lines BL and /BL for controlling the output of the data outputted from the memory cells MC, and first and second sense amplifying units 60 and 70 connected to the pairs of the bit lines BL and /BL through the first and second switching units 40 and 50 for amplifying the data outputted from the memory cell MC to a certain level.

In addition, the word line driver 20 is a latch type capable of concurrently selecting at least two memory cells connected to the bit lines BL and /BL, and the first and second sense amplifying units 60 and 70 sense the data contained on the bit lines BL and /BL, each including a bidirectional latch type sense amplifying unit SA for recording the sensed data in the memory cell MC.

The operation of the memory driving method for a semiconductor memory apparatus according to the present invention will now be explained with reference to FIGS. 4 through 6.

To begin with, in a state that the switch S1' of the first switching unit 40 is turned on by a switching control signal SW1' as shown in FIG. 6B, when a word line signal of a high level as shown in FIG. 6A is inputted to the memory array 10 in the word line driver 20, a data of the memory cell MC1 located at a crossing point between the word line WL1 and the bit line BL1 is charged and discharged to the bit lines BL1 and /BL1, and inputted to the sense amplifying unit SA1' through the turned-on switch S1' and the input and output lines SL1' and /SL1' of the sense amplifying unit SA1'.

Thereafter, the sense amplifying unit SA1' performs a sensing operation by receiving electric charge through the input and output lines SL1 and /SL1, and the data stored in the memory cell MC1 is read in accordance with a turning-on of the switch S1' during a sensing operation as shown in FIG. 6G.

Thereafter, in a state that a switching control signal SW1 as shown in FIG. 6E is inputted to the switch S1 of the second switching unit 50, when a word line signal WL3 of a high level as shown in FIG. 6D is inputted to the word line driver 20, a data of a memory cell MC3 located at a crossing point between the word line WL3 and the bit line BL1 is charged and discharged and inputted to the sense amplifying unit SA1 through the turned-on switch S1 and the input and output lines SL1 and /SL1 of the sense amplifying unit SA1.

Therefore, the sense amplifying unit SA1 performs a sensing operation by receiving an electric charge through the input and output lines SL1 and /SL1, and the data stored in the memory cell MC3 is read as shown in FIG. 6G in accordance with a turning-off of the switch S1 during a sensing operation.

At this time, the data of the memory cell MC1 is sensed by the sense amplifying unit SA1' or the sense of the same is completed before the word line WL3 is selected, and when the word line WL3 is selected, and the data of the memory cell MC3 is sensed by the sense amplifying unit SA1.

Therefore, the data read from the memory cells MC1 and MC3 are sensed by the sense amplifying units SA1' and SA1, respectively, and the sensing and reading operations are performed with respect to the entire word and bit lines, so that a series of data reading operations can be possible.

Meanwhile, in a recording mode, in a state that the switching control signal SW1' as shown in FIG. 7B is inputted to the switch S1' of the first switching unit 40, and the switch S1' is turned on, when the word line signal WL1 of a high level as shown in FIG. 7A is inputted to the word line driver 20, the data Dq amplified by the sense amplifying unit SA1' is outputted to the input and output lines SL1' and /SL1' of the sense amplifying unit SA1', and the electric charge of the same is charged and discharged to the bit lines BL1 and /BL1 through the mined-on switch S1' and recorded in the memory cell MC1 as shown in FIG. 7G.

Thereafter, in a state that a switching control signal SW1 as shown in FIG. 7E is inputted to the switch S1, when a word line signal WL3 of a high level as shown in FIG. 7D is inputted to the word line driver 20, the data D1 amplified by the sense amplifying unit SA1 is outputted to the input and output lines SL1 and /SL1 of the sense amplifying unit SA1 as shown in FIG. 7F, and the electric charge outputted therefrom is charged and discharged to the bit lines BL1 and /BL1 through the turned-on switch S1 and recorded in the memory cell MC3 as shown in FIG. 7G. Thereafter, the above-mentioned sensing and recording operations are performed with respect to the entire word and bit lines of FIG. 5, so that a series of data recording operations is possible.

As described above, the memory driving method for a semiconductor memory apparatus according to the present invention is directed to achieving a series of data accesses by connecting two sense amplifying units to a pair of bit lines, selecting one word line, performing a data sensing operation, selecting another word line without resetting the sense amplifying unit, and recording the sensed data in a corresponding memory cell in accordance with a selected switch and a word line, so that data access time of the system can be advantageously reduced.

What is claimed is:

1. A memory driving method for a semiconductor memory apparatus wherein first and second sense amplifying units are connected to a pair of bit lines of a memory array, respectively, through first and second switches, and a latch type word line driver capable of concurrently selecting at least two memory cells connected to one bit line is provided in said semiconductor memory apparatus, comprising the steps of:

a first step which senses a data of a first memory cell selected by said word line driver and stores the thusly sensed data into said first sense amplifying unit in accordance with a switching operation of a first switch;

a second step which selects a second memory cell during the sensing operation of said first sense amplifying unit and stores a data of said second memory cell into said second sense amplifying unit in accordance with a switching operation of a second switch; and a third step which restores data stored in the first sense amplifying unit and second sense amplifying unit into said first and second selected memory cells, respectively, in accordance with said switching operation of said first and second switches.

2. The method of claim 1, wherein said first and second switches of said first and second steps are turned on before a word line is enabled, and the first switch is turned off before the second switch is turned on.

3. The method of claim 1, wherein said first and second switches of said third step are turned on before a word line is enabled, and are turned off after said word line is disabled.

* * * * *